US008587055B2

(12) United States Patent
Stiftinger et al.

(10) Patent No.: US 8,587,055 B2
(45) Date of Patent: Nov. 19, 2013

(54) INTEGRATED CIRCUIT USING A SUPERJUNCTION SEMICONDUCTOR DEVICE

(75) Inventors: Martin Stiftinger, Stockdorf (DE); Snezana Jenei, Munich (DE); Wolfgang Werner, Munich (DE); Uwe Hodel, Munich (DE)

(73) Assignee: Infineon Technologies AG, Neubiberg (DE)

( * ) Notice: Subject to any disclaimer, the term of this patent is extended or adjusted under 35 U.S.C. 154(b) by 260 days.

(21) Appl. No.: 11/678,455

(22) Filed: Feb. 23, 2007

(65) Prior Publication Data
US 2008/0203480 A1    Aug. 28, 2008

(51) Int. Cl.
  *H01L 29/66*    (2006.01)
(52) U.S. Cl.
  USPC .... 257/335; 257/341; 257/343; 257/E29.066; 257/E29.256
(58) Field of Classification Search
  USPC .................. 257/141, 341, 335, 343, E29.066, 257/E29.256, 192, 557, 575, E29.027, 257/E29.197
  See application file for complete search history.

(56) References Cited

U.S. PATENT DOCUMENTS

| 4,626,879 | A | * | 12/1986 | Colak | 257/336 |
|---|---|---|---|---|---|
| 5,294,824 | A | * | 3/1994 | Okada | 257/409 |
| 5,438,215 | A | * | 8/1995 | Tihanyi | 257/401 |
| 6,023,090 | A | * | 2/2000 | Letavic et al. | 257/347 |
| 6,097,063 | A | * | 8/2000 | Fujihira | 257/339 |
| 6,111,289 | A | | 8/2000 | Udrea | |
| 6,297,534 | B1 | * | 10/2001 | Kawaguchi et al. | 257/341 |
| 6,353,252 | B1 | * | 3/2002 | Yasuhara et al. | 257/487 |
| 6,528,849 | B1 | * | 3/2003 | Khemka et al. | 257/342 |
| 6,566,709 | B2 | * | 5/2003 | Fujihira | 257/339 |
| 6,768,180 | B2 | * | 7/2004 | Salama et al. | 257/401 |
| 6,878,999 | B2 | * | 4/2005 | Hower et al. | 257/343 |
| 7,535,059 | B2 | * | 5/2009 | Yoshikawa et al. | 257/341 |
| 2003/0190789 | A1 | | 10/2003 | Salama et al. | |
| 2005/0017300 | A1 | * | 1/2005 | Salama et al. | 257/342 |
| 2005/0116313 | A1 | * | 6/2005 | Lee et al. | 257/500 |

OTHER PUBLICATIONS

Baldwin, G., et al., "90nm CMOS RF technology with 9.0V I/O capability for single-chip radio", *Texas Istruments; Symposium on VLSI Technology Digest of Technical Papers*;4-89114-035-6/03, (2003),20pgs.

Heringa, A., et al., "Novel power transistor design for a process independent high voltage option in standard CMOS", *Philips Research Leuven, Belgium; Proceedings of the 18th International Symposium on Power Semiconductor Devices and ICs*, Jun. 4-8, 2006, Naples, Italy, (2006),4 pgs.

Muller, Dorothee, et al., "Comparison of two types of lateral DMOSFET optimized for RF power applications", *Proceedings of ESSDERC*, Grenoble, France, 2005, (2005),4 pgs.

Rickert, P, et al., "SoC integration in deep submicron CMOS", *Texas Istruments; IEEE* 0-7803-8684-1/04 (2004),4 pgs.

"German Application Serial No. 10 2008 010 321.7, Office Action Mailed Sep. 1, 2009", 3 pgs.

* cited by examiner

*Primary Examiner* — S. V. Clark
*Assistant Examiner* — Jesse Y Miyoshi
(74) *Attorney, Agent, or Firm* — Schwegman Lundberg & Woessner, P.A.

(57) ABSTRACT

In an embodiment, an apparatus includes a source region, a gate region and a drain region supported by a substrate, and a drift region including a plurality of vertically extending n-wells and p-wells to couple the gate region and the drain region of a transistor, wherein the plurality of n-wells and p-wells are formed in alternating longitudinal rows to form a superjunction drift region longitudinally extending between the gate region and the drain region of the transistor.

9 Claims, 3 Drawing Sheets

INTEGRATED CIRCUIT USING A SUPERJUNCTION SEMICONDUCTOR DEVICE

TECHNICAL FIELD

Various embodiments described herein relate to semiconductor devices and a method of fabrication thereof.

BACKGROUND

Semiconductor devices with large current capacity and a high breakdown voltage, are needed in today's applications. Some examples of such devices are lateral diffused metal-oxide semiconductor field-effect transistors and Insulated Gate Bipolar Transistors. A superjunction configuration provides for a high gate-drain breakdown voltage.

DETAILED DESCRIPTION

Figure 1A:
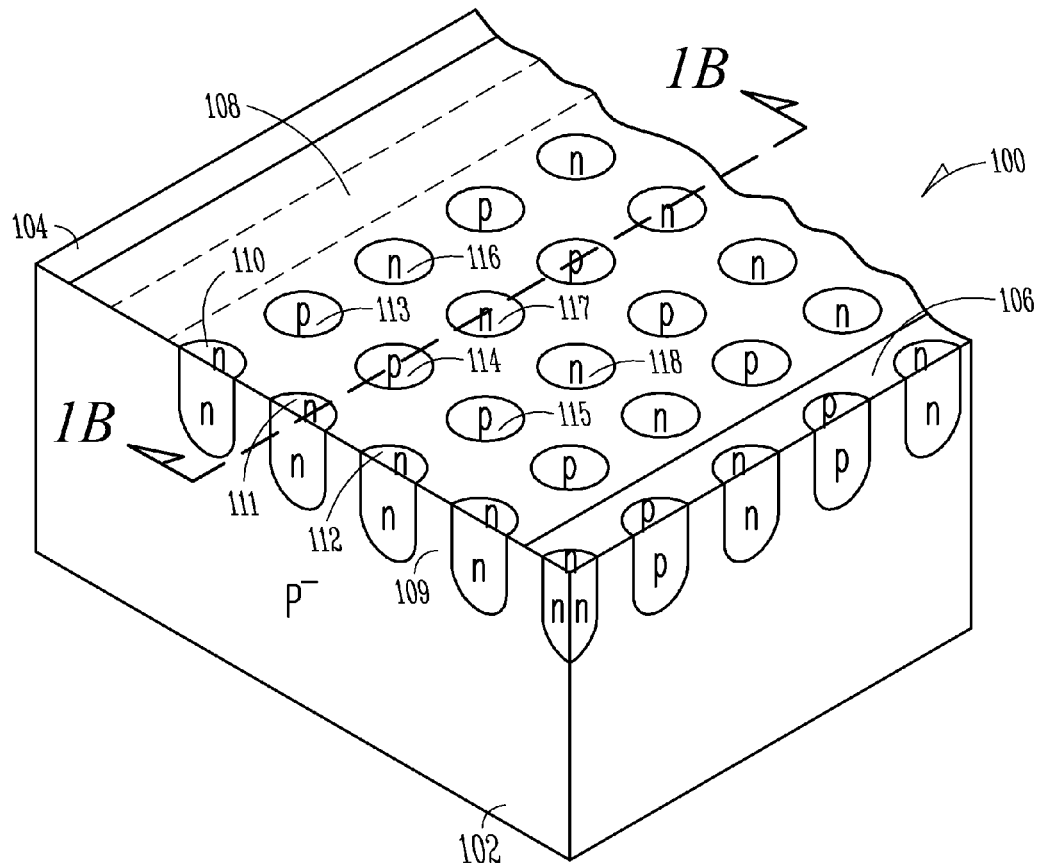
FIG. 1A illustrates a perspective view of a partially formed semiconductor device having a superjunction structure, according to some embodiments of the invention.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. In this document, the terms "a" or "an" are used, as is common in patent documents, to include one or more than one. In this document, the term "or" is used to refer to nonexclusive or, such that "A or B" includes "A but not B," "B but not A," and "A and B," unless otherwise indicated.

In the following description, the terms "wafer" and "substrate" may be used interchangeably to refer generally to any structure on which integrated circuits are formed and also to such structured during various stages of integrated circuit fabrication. The term "substrate" is understood to include a semiconductor wafer. The term "substrate" is also used to refer to semiconductor structures during processing and may include other layers that have been fabricated thereupon. Both "wafer" and "substrate" include doped and undoped semiconductors, epitaxial semiconductor layers supported by a base semiconductor or insulator, as well as other semiconductor structures well known to one skilled in the art.

The term "conductor" is understood to generally include n-type and p-type semiconductors and the term "insulator" or "dielectric" is defined to include any material that is less electrically conductive than the materials referred to as "conductors." The following detailed description is, therefore, not to be taken in a limiting sense.

The performance of power integrated circuits relies heavily on the on-state and off-state characteristics of later power metal oxide semiconductor field effect transistors. In general, current CMOS fabrication processes have been unable to provide such high voltage devices without the addition of complicated process steps during fabrication of these devices. Typically, fabrication of such high voltage devices include providing a lightly doped drain region or providing various implants that are used throughout the whole width of the device (using thin stripes or pillars) to build a drift region between drain and gate of the transistor. Devices made using the above mentioned fabrication schemes may not be able to achieve maximum breakdown voltages over 10V without the incorporation of additional process steps in the fabrication process. The extra process steps would include additional masking steps, implantation steps, thermal steps and/or other steps for the drift regions and/or the drain region surface to allow for a higher voltage drop in the drain region. These additional steps result in an increase in fabrication costs for such devices.

Cost considerations in the IC industry require high volume products to be manufactured in a standard CMOS technology. Moreover, for further reduction in the device size used for current applications (such as for e.g., mobile phones, DSL devices, power amplifiers), a system on chip (SoC) configuration is desired. A system on chip design allows for the various individual functionalities of multiple chips to be incorporated onto a single chip. In such a SoC device, different parts of the chip may have different voltage requirements. As the system may need to handle higher voltages (received from batteries and antenna, or for driving long lengths of copper wire) high voltage devices have to be provided and supported within these applications. It is most advantageous if the integration of such devices does not increase the complexity of the basic CMOS fabrication process.

Superjunction structures operate at high voltages using oppositely doped regions placed adjacent to each other that are depleted to provide high drain voltage by creating an efficient voltage drop from the drain to the channel region. Such superjunction structures may be fabricated by providing stripes of "p" and "n" regions over the substrate. The "p" and "n" regions are long and narrow strips for achieving high drain voltages. Due to their long and narrow structure, the patterned photoresist stripes necessary for the implantation of these strips become mechanically unstable during the fabrication process and consequently collapse and spoil the wafer. As a result of the collapse of the long photoresist stripes for the "p" or "n" region, the device that is being fabricated and other existing devices on the substrate may be destroyed.

FIG. 1A illustrates a perspective view of a partially formed semiconductor device 100 having a superjunction structure, according to some embodiments of the invention. Partially formed semiconductor device 100 includes a substrate 102, regions where, later in the fabrication process, a source region 104, a drain region 106, and a gate region 108 will be formed, and a drift region 109. Source region 104, drain region 106 and gate region 108 are regions where the source, drain and gate are formed in the fabrication process, respectively. Substrate 102 includes materials such as silicon or silicon on an isolating later (such as SiO2). In some embodiments, such as that shown in FIG. 1A, substrate 102 includes a dopant of "p-"

type conductivity. In some embodiments, substrate 102 includes a p-type epitaxial layer that is grown using a chemical vapor deposition process.

In some embodiments, drift region 109 includes a number of n-wells 110, 111, 112, 116, 117 and 118 and p-wells 113, 114 and 115 formed between gate region 108 and the drain region 106 as shown in FIG. 1A. In some embodiments, the n-wells 110, 111, 112, and 113, the p-wells 113, 114, 115 and the n-wells 116, 117 and 118 are respectively arranged in longitudinal rows along the width of drift region 109. In some embodiments, the rows formed by n-wells and p-wells alternate each other within the drift region 109 located between the gate region 108 and the drain region 106.

In some embodiments, semiconductor device 100 includes an n-FET configuration. In some embodiments, the semiconductor device 100 includes a p-FET configuration.

Figure 1B:
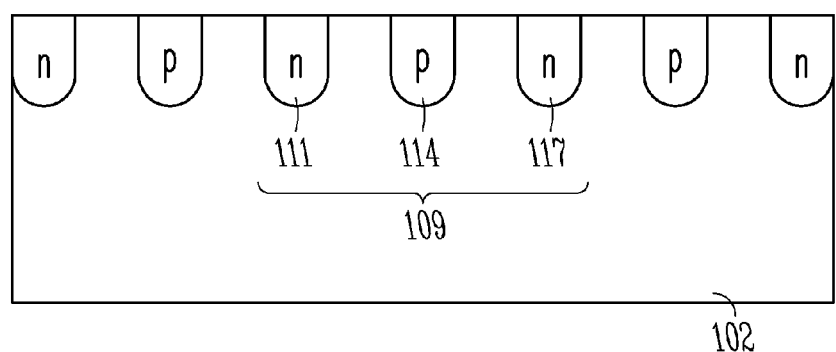
FIG. 1B illustrates a cross sectional view of the semiconductor device shown in FIG. 1A, according to some embodiments of the invention.

FIG. 1B illustrates a cross-sectional view of the partially formed semiconductor device 100 shown in FIG. 1A, according to some embodiments of the invention. From left to right n-wells alternate with p-wells throughout the drift region 109 and either side of the drift region. FIG. 1B shows n-well 111 located near p-well 114 such that some portion of the substrate 102 separates the two wells. Similarly, p-well 114 is located near n-well 117 such that some portion of the substrate 102 separates the two wells. In some embodiments n-well 111, p-well 114 and n-well 117 are arranged in a staggered arrangement such that they are not aligned uniformly along AA'. However, in the direction from the gate region towards drain region, the n-wells are adjacent to n-wells and p-wells are adjacent to p-wells. In some embodiments, the distance between the wells may vary depending on the distance from the gate region or the drain region.

In some embodiments, the size of the n-wells and the p-wells may be adjusted to achieve a particular desired gate-drain breakdown voltage. In some embodiments, the width of each of the n-wells can be substantially the same and the width of each of the p-wells can be substantially the same. In some embodiments, the width of each of the n-wells are substantially the same as the width of each of the p-wells. In some embodiments, the depth of each of the n-wells are substantially the same. In some embodiments, the depth of each of the p-wells are substantially the same. In some embodiments, the depth of each of the n-wells are substantially the same as the depths of the p-wells.

Figure 2:
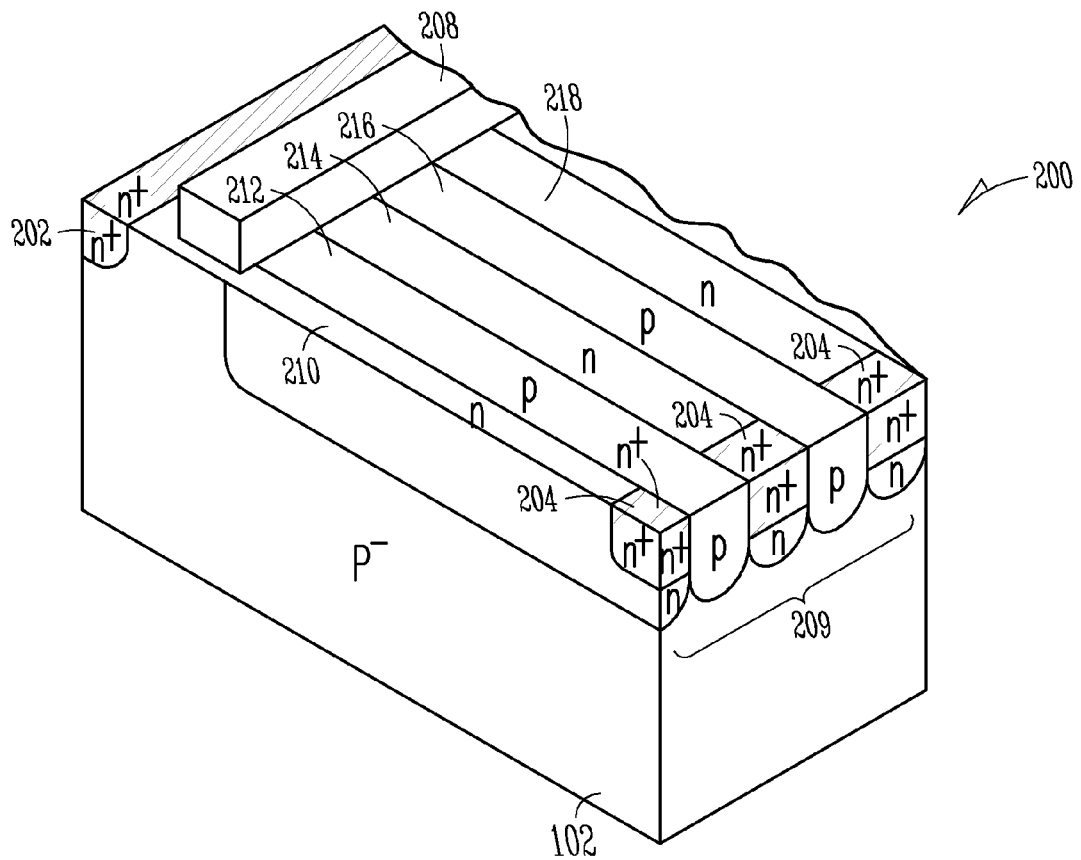
FIG. 2 illustrates a perspective view of a semiconductor device having a superjunction structure, according to some embodiments of the invention.

FIG. 2 illustrates a perspective view of a semiconductor device 200 having a superjunction structure, according to some embodiments of the invention. Semiconductor device 200 includes substrate 102, a source 202, a gate 208, a drain 204 and drift region 209 including rows of n-type longitudinally conducting strips 210, 214, and 218 and rows of p-type longitudinally conducting strips 212, and 216. In some embodiments, additional rows (not shown) of n-type and p-type conducting stripes are formed on either side of the drift region 109 in order to prevent breakdown of the device in the width direction (perpendicular to the longitudinal direction). These additional conducting stripes that are not terminated or coupled to any termination can be considered floating stripes. In some embodiments, rows of n-type conducting stripes 210, 214, 218 and p-type conducting strips 212, 216 and the additional stripes mentioned above are formed by performing an annealing process on the substrate 102 and drift region 109 shown in FIG. 1A-1B. As a result of the annealing process, dopant present within the n-wells and p-wells shown in FIG. 1A diffuses to the surrounding substrate thereby forming conducting strips 210, 212, 214, 216 and 218. In some embodiments, the width and depth of each of the conducting strips 210, 212, 214 can be adjusted by varying the width and depth of n-wells 110, 111, 112, 116, 117, 118 and p-wells 113, 114, 115. Additionally, in some embodiments, the anneal process can also be used to control the width of the conducting strips 210, 212, 214, 216 and 218.

Figure 3:
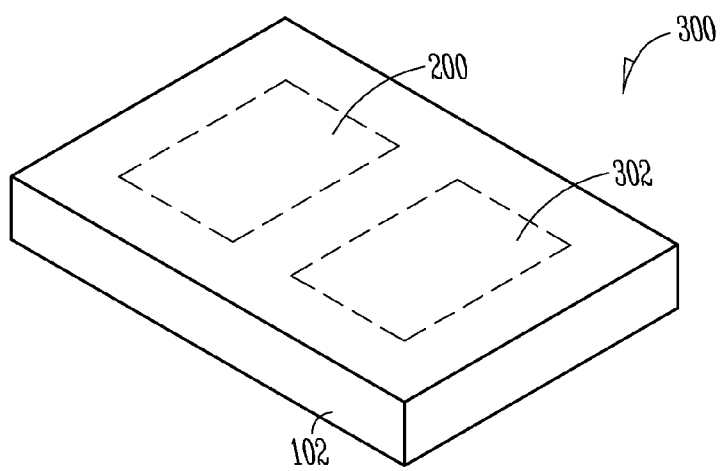
FIG. 3 illustrates a perspective view of a system including a semiconductor device having a superjunction structure, according to some embodiments of the invention.

FIG. 3 illustrates a perspective view of a system including a semiconductor device having a superjunction structure, according to some embodiments of the invention. System 300 includes a substrate 102, a device 200 having a superjunction structure and a logic device 302 having a conventional CMOS structure. In some embodiments, device 200 and logic device 302 are supported by substrate 102. In some embodiments, device 200 and logic gate 302 are configured such that they share the same substrate 102.

Figure 4:
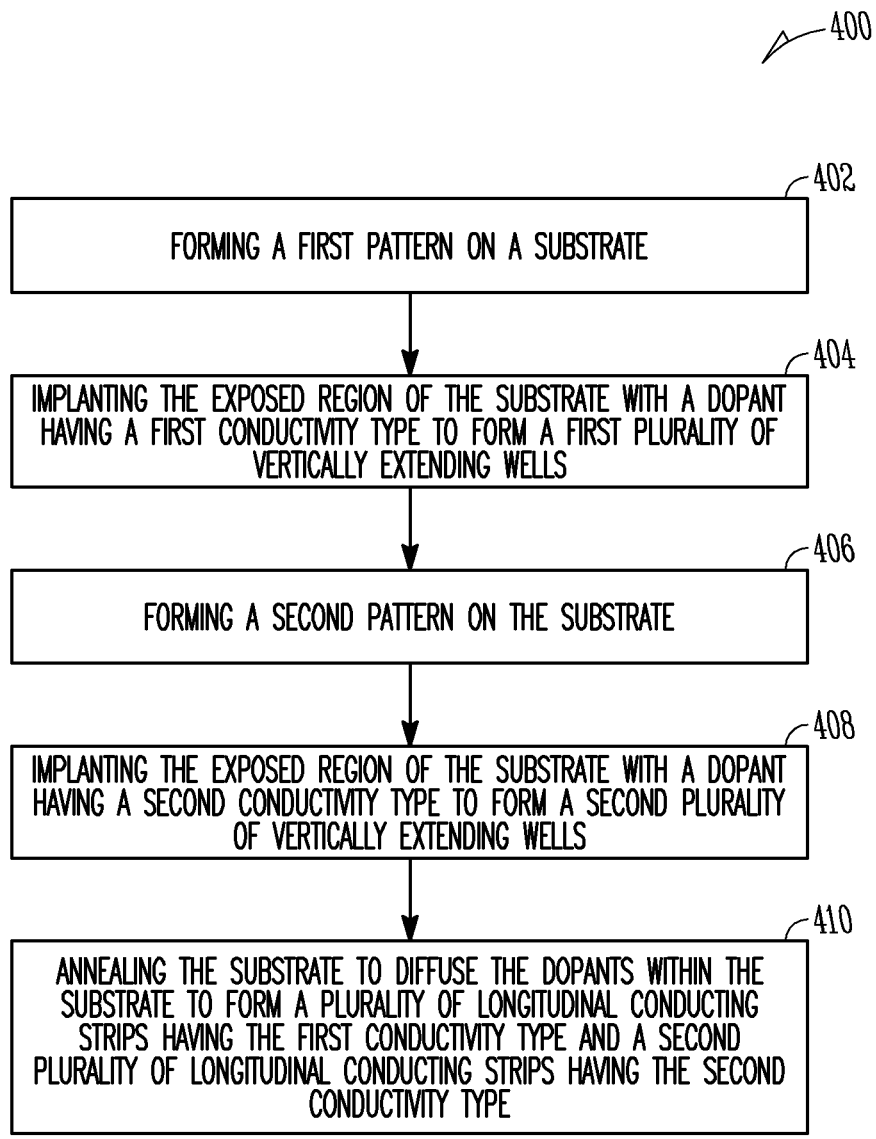
FIG. 4 illustrates a flow chart describing a method of fabrication of the semiconductor device shown in FIG. 2, according to some embodiments of the invention.

FIG. 4 illustrates a flow chart describing a method 400 of fabrication of the semiconductor device shown in FIG. 2, according to some embodiments of the invention. In some embodiments, method 400 includes the fabrication of semiconductor device 200 in conjunction with fabrication of other logic gate devices such as 302 on the same substrate 102 to form a system on chip device.

At 402, the method includes depositing, masking, exposing and developing a resist layer, leaving behind exposed areas on the silicon substrate 102, i.e., areas having no resist layer covering the substrate.

At 404, the method includes implanting the exposed areas on the substrate formed at 406 using a dopant having a particular conductivity type (such as n-type or p-type). In some embodiments, implanting the exposed areas on the substrate includes subjecting the substrate to a diffusion or ion implantation process thereby receiving dopants and forming a number of wells (such as n-wells or p-wells). In some embodiments, the dopant used to form an n-well includes an n-type dopant such as phosphorus. In some embodiments, the dopant used to form a p-well includes a p-type dopant such as boron.

At 406, the method includes forming a second pattern on the substrate 102. In some embodiments, the method includes photoresist deposition, masking, exposing and developing to form specific patterns, leaving behind exposed areas on the substrate, i.e., areas having no resist layer covering the substrate.

At 408, the method includes implanting the exposed areas on the substrate formed at 406 using a dopant having a particular conductivity type (such as n-type or p-type). In some embodiments, implanting the exposed areas on the substrate includes subjecting the substrate to a diffusion or ion implantation process similar to that performed at 404. At 408, dopants are received on the surface of the substrate to form a number of wells (such as n-wells or p-wells). In some embodiments, the dopant used to form a number of wells includes a dopant having an opposite polarity compared to the wells formed at 404.

At 410, the method includes annealing the substrate to diffuse and activate the dopants within the substrate to form a first plurality of longitudinal conducting strips having a first conductivity type and a second plurality of longitudinal conducting strips having the second conductivity type. In some embodiments, the method includes doping a source region 104 and a drain region 106 using a dopant having "n+" conductivity for n-MOS devices or a "p+" conductivity for p-MOS devices. In some embodiments, the method includes forming a gate 208 supported the gate region 108. For p-MOS devices this includes the formation of an additional layer having "n" conductivity enclosing the drift region in order to electrically isolate the drain from the substrate. This n-layer may also be formed together with the formation of the n-well and p-well stripes in the drift region.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description. In the previous discussion and in the claims, the terms "including" and "comprising" are used in an open-ended fashion, and thus should be interpreted to mean "including", but not limited to . . . ."

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. An apparatus, comprising:
   a source region, a gate region and a drain region supported by a substrate; and
   a drift region extending horizontally between the source region and the drain region and including a plurality of n-type conducting strips and p-type conducting strips to couple the gate region and the drain region of a transistor, wherein the plurality of n-type conducting strips and p-type conducting strips are formed in alternating longitudinal rows longitudinally extending between the gate region and the drain region of the transistor, wherein each of a plurality of drain regions extends partially into the n type conductive strips, wherein each of the drain regions do not extend into the p type conducting strips, wherein the drain region has a higher impurity concentration than the n-type conducting strips, wherein the p type conducting strips separate each of the plurality of drain regions, and wherein the drift region is separated from the source region by a portion of the substrate.

2. The apparatus of claim 1, wherein the drift region includes
   the plurality of n-type conducting strips formed by a plurality of vertically extending n-wells; and
   the plurality of p-type conducting strips formed by a plurality of vertically extending p-wells, wherein the plurality of n-type and p-type strips extend between the gate region and the drain region of the transistor.

3. The apparatus of claim 1, wherein the apparatus includes an n-MOS transistor.

4. The apparatus of claim 1, wherein the apparatus includes a p-MOS transistor.

5. An integrated circuit comprising:
   a logic device supported by a substrate and coupled to a first source of reference potential; and
   a transistor supported by the substrate including,
      a source region, a gate region and a drain region, and
      a drift region extending horizontally between the source region and the drain region and including a plurality of n-type conducting strips and p-type conducting strips to couple the gate region and the drain region of a transistor, wherein the plurality of n-type conducting strips and p-type conducting strips are formed in alternating longitudinal rows to form a drift region longitudinally extending between the gate region and the drain region of the transistor, wherein each of a plurality of drain regions extends partially into the n type conductive strips, wherein each of the drain regions do not extend into the p type conducting strips, wherein the drain region has a higher impurity concentration than the n-type conducting strips, wherein the p type conducting strips separate each of the plurality of drain regions, wherein the drift region is separated from the source region by a portion of the substrate, and wherein the transistor is coupled to a second source of reference potential having a potential greater than the potential of the first source of reference potential.

6. The integrated circuit of claim 5, wherein the transistor includes an n-MOS transistor.

7. The integrated circuit of claim 5, wherein the transistor includes a p-MOS transistor.

8. An apparatus, comprising:
   a source region, a gate region, and a drain region supported by a substrate; and
   a plurality of n-type conducting strips and p-type conducting strips formed in alternating longitudinal rows longitudinally extending between the gate region and the drain region, wherein each of a plurality of drain regions extends partially into the n type conductive strips, wherein each of the drain regions do not extend into the p type conducting strips, wherein the drain region has a higher impurity concentration than the n-type conducting strips, and wherein the p type conducting strips separate each of the plurality of drain regions.

9. An apparatus, comprising:
   a source region, a gate region, and a drain region supported by a substrate; and
   a plurality of alternating n-type conducting strips and p-type conducting strips longitudinally extending between the gate region and the drain region, wherein each of a plurality of drain regions extends partially into the n type conductive strips, wherein each of the drain regions do not extend into the p type conducting strips, wherein the drain region has a higher impurity concentration than the n-type conducting strips, and wherein the p type conducting strips separate each of the plurality of drain regions.

* * * * *